(12) United States Patent
Oota et al.

(10) Patent No.: US 6,423,463 B1
(45) Date of Patent: Jul. 23, 2002

(54) PHOTOSENSITIVE RESIN COMPOSITION, PHOTOSENSITIVE RESIN FILM, AND METHOD OF FORMING BUMPS USING SAME

(75) Inventors: Masaru Oota; Isamu Mochizuki; Kouichi Hirose; Yasuaki Yokoyama; Hozumi Sato, all of Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/516,211

(22) Filed: Feb. 29, 2000

(30) Foreign Application Priority Data

Mar. 4, 1999 (JP) .......................................... 11-057022

(51) Int. Cl.⁷ ............................. G03F 7/023; G03F 7/30
(52) U.S. Cl. ..................... 430/191; 430/192; 430/193; 430/315
(58) Field of Search ................................. 430/191, 192, 430/193, 315

(56) References Cited

U.S. PATENT DOCUMENTS 5,266,440 A * 11/1993 Zampini ...................... 430/192
6,171,750 B1 * 1/2001 Inomata et al. ............. 430/191

* cited by examiner

Primary Examiner—John S. Chu
(74) Attorney, Agent, or Firm—Oblon, Spivak, McClelland, Maier & Neustadt, P.C.

(57) ABSTRACT

A positive-tone photosensitive resin composition for forming a thick film which is suitably used for photofabrication such as manufacture of circuit boards, a photosensitive resin film, and a method of forming a bump using the same. The photosensitive resin composition comprising (A) a novolac resin with a weight average molecular weight of 2,000–30,000, (B) a polyvinyl lower alkyl ether, (C) a polyphenol derivative compound with a molecular weight of 200–1,000, and (D) a compound containing a naphthoquinonediazido group.

12 Claims, No Drawings

PHOTOSENSITIVE RESIN COMPOSITION, PHOTOSENSITIVE RESIN FILM, AND METHOD OF FORMING BUMPS USING SAME

BACKGROUND OF THE INVENTION

1. Field of the Invention

The present invention relates to a photosensitive resin composition. More particularly, the present invention relates to an alkali-developable positive-tone photosensitive resin composition for forming a thick film which is suitably used for photofabrication, such as formation of bumps or wiring, or fabrication of interlayer dielectric, circuit protective films, or precision parts in the manufacture of circuit boards or mounting of a semiconductor or electronic parts on circuit boards, to a photosensitive resin film, and to a method of forming bumps using the same.

2. Description of Background Art

Photofabrication is a generic term for a technique of manufacturing various precision parts. In photofabrication, a photosensitive resin composition is applied to a substrate, that is, the surface of a processed object. The film is patterned by a photolithographic technique. The substrate is then subjected to an electroforming technique such as chemical etching, electrolysis etching, or electroplating individually or in combination using the patterned film as a mask to form precision parts. At present, photofabrication is the mainstream of precision microfabrication.

In recent years, LSIs have been highly integrated and rapidly switched over to the application of specific integrated circuits (ASIC) to deal with downsized electronic equipment. Therefore, multiple-pin thin film mounting has been demanded for installing LSIs in electronic equipment. Bare chip mounting by a tape automatic bonding (TAB) method and flip chip method has attracted attention. In such a multiple-pin mounting method, it is necessary to arrange connecting terminals, which are projection electrodes with a height of 20 $\mu$m or more ("bumps"), on the substrate with high precision. Considering further downsizing of LSIs in the future, bumps must be formed with higher precision and a narrower pitch.

The following characteristics are required for photosensitive resin compositions used for forming bumps: capability of forming a film with a thickness of 20 $\mu$m or more; patterned films having adhesion to substrates; plating resistance and good wettability with a plating solution at the time of plating for forming bumps; and capability of being easily removed by a removing solution after plating. To deal with transition to narrower pitch bumps along with highly integrated LSIs, high resolution and an excellent pattern shape in which the sidewall of the resist pattern is almost vertical are required for materials for forming bumps.

The patterned film must exhibit no cracks during plating or on washing with water and drying after plating. If cracks occur in the patterned film during plating, plating is deposited in an undesirable area, thereby causing a short circuit. If cracks occur in the patterned film after plating and it is necessary to replate to provide an adequate plating thickness, plating is deposited in the cracks during replating. This results in plating with a bad shape. Accordingly, inhibiting the occurrence of cracks during or after plating is an important requirement for photosensitive resin compositions used for forming thick plating.

However, conventional photosensitive resin compositions comprising a novolac resin, a compound containing a naphthoquinonediazido group, and other additives used as materials for forming bumps are unsatisfactory, particularly in inhibiting the occurrence of cracks. Cracks easily occur in patterned films made from such photosensitive resin compositions due to fragility. Moreover, such patterned films are removed from the substrates because of poor adhesion.

As countermeasures for solving such problems, use of polymers with a comparatively low glass transition temperature such as polyvinyl ether or acrylic resins as plasticizers has been considered. Alkali-soluble photosensitive resin compositions comprising a novolac resin, a naphthoquinonediazido group-containing compound, and polyvinyl ether are known in the art. Such photosensitive resin compositions are disclosed in U.S. Pat. No. 3,634,082, Japanese Patent Publication No. 16049/1971, and the like. Japanese Patent Publication No. 54169/1993 discloses a mixture of a novolac resin photoresist and polyvinyl methyl ether used as a material for removing the level differences in thin-film magnetic heads. However, polyvinyl ether which is soluble in an alkaline developer decreases the contrast of the photosensitive resin composition as a resist and worsen the pattern shape.

Japanese Patent Application Laid-open No. 207057/1998 discloses a positive-tone photoresist composition which comprises acrylic resins in order to mainly improve the plating resistance. This technology decreases occurrence of cracks. However, a large amount of acrylic resins added to inhibit cracks decreases the contrast as a resist and worsens the pattern shape.

An object of the present invention is to provide a photosensitive resin composition suitable for forming bumps or wiring, which is capable of producing a uniform film with a thickness of 20 $\mu$m or more, exhibits high resolution, excellent plating shape, no plating spotting out, and no cracks in the film during plating or on washing with water and drying after plating, by adding polyvinyl ether and a polyphenol derivative compound to a photosensitive resin composition comprising a novolac resin. A further object of the present invention is to provide a photosensitive resin film and a method of forming bumps using the composition.

SUMMARY OF THE INVENTION

In order to achieve the above object, the present invention provides a photosensitive resin composition comprising (A) a novolac resin with a weight average molecular weight (polystyrene-reduced value by a GPC method) of 2,000–30,000, (B) a polyvinyl lower alkyl ether, (C) a polyphenol derivative compound with a molecular weight of 200–1,000, and (D) a compound containing a naphthoquinonediazido group.

In a preferred embodiment, the above photosensitive resin composition comprises 5–60 wt % of the naphthoquinone diazido group-containing compound (D) for 100 wt % of a resin component comprising 30–90 wt % of the novolac resin (A), 5–60 wt % of the polyvinyl lower alkyl ether (B), and 3–40 wt % of the polyphenol derivative compound (C).

The present invention also provides a photosensitive resin film which is prepared by applying any one of the above-described photosensitive resin compositions to a substrate, and then drying the applied resin composition.

Furthermore, the present invention provides a method for forming projection electrodes on a substrate, comprising applying any one of the above-mentioned photosensitive resin compositions to a substrate for an electronic part; patterning the applied composition; and electroplating the substrate to a thickness of 20–100 $\mu$m, thereby forming the projection electrodes which function as connecting terminals in the completed electronic part.

The present invention will be described in more detail below.

DETAILED DESCRIPTION OF THE INVENTION AND PREFERRED EMBODIMENT

(A) Novolac Resin

The novolac resin (A) used in the present invention is prepared by the addition condensation of an aromatic compound having a phenolic hydroxyl group (hereinafter referred to as "phenols") with aldehydes preferably in a ratio of 1 mol of the phenols to 0.7–1 mol of aldehydes in the presence of catalysts. As examples of the phenols, phenol, o-cresol, m-cresol, p-cresol, o-ethylphenol, m-ethylphenol, p-ethylphonol, o-butylphenol, m-butylphenol, p-butylphenol, 2,3-xylenol, 2,4-xylenol, 2,5-xylenol, 2,6-xylenol, 3,4-xylenol, 3,5-xylenol, 3,6-xylenol, 2,3,5-trimethylphenol, 3,4,5-trimethylphenol, p-phenylphenol, resorcinol, hydroquinone, hydroquinone monomethyl ether, pyrogallol, fluoroglycynol, hydroxydiphenyl, bisphenol A, gallic acid, gallic acid ester, α-naphthol, and β-naphthol can be given. As examples of aldehydes, formaldehyde, paraformaldehyde, furfural, benzaldehyde, nitrobenzaldehyde, and acetaldehyde can be given. As acid catalysts, hydrochloric acid, nitric acid, sulfuric acid, formic acid, oxalic acid, and acetic acid can be used.

The weight average molecular weight of the novolac resin (weight average molecular weight used in the present invention is a polystyrene-reduced value determined by the GPC method) is from 2,000 to 30,000, and preferably from 3,000 to 20,000, from the viewpoint of developability, resolution, and plating solution resistance of the resulting photosensitive resin composition film. If the weight average molecular weight is less than 2,000, the developing time becomes too short. If more than 30,000, the developing time becomes too long. In both cases, resolution decreases remarkably.

The proportion of the novolac resin to be mixed in the photosensitive resin composition of the present invention is preferably 30–90 wt %, and still more preferably 40–80 wt %, of 100 wt % of the resin component which comprises the novolac resin(A), polyvinyl lower alkyl ether (B), and polyphenol derivative compound (C) as essential components. If the novolac resin is less than 30 wt %, contrast tends to be inadequate. If the novolac resin exceeds 90 wt %, cracks may occur.

(B) Polyvinyl Lower Alkyl Ether

The polyvinyl lower alkyl ether used in the present invention is a polymer having a recurring unit shown by the formula —CH$_2$—CHOR—. R in the above formula represents a lower alkyl group such as an alkyl group having 1–5 carbon atoms. Specific examples include a methyl group, ethyl group, n-propyl group, isopropyl group, n-butyl group, isobutyl group, n-amyl group, and isoamyl group. Of these, a methyl group, ethyl group, and isobutyl group are preferable. A methyl group is particularly preferable.

The polyvinyl lower alkyl ether (B) used in the present invention may be liquid or a wax-like resin at room temperature depending on the degree of polymerization. Either of the form is selectively used.

The proportion of the polyvinyl lower alkyl ether (B) to be mixed in the resin component comprising the components (A), (B), and (C) as the essential components is preferably 5–60 wt %, and still more preferably 10–50 wt %. If the proportion is less than 5 wt %, when electroplating a thick film made from the composition of the present invention, cracks may occur in the film on washing with water and drying after plating. If the proportion exceeds 60 wt %, a pattern with a good shape cannot be obtained due to inadequate contrast between the exposed and unexposed areas at the time of development.

(C) Polyphenol Derivative Compound

The molecular weight of the polyphenol derivative compound used in the present invention is from 200 to 1,000, and preferably from 290 to 1,000. If the molecular weight is less than 200, resolution becomes insufficient. If the molecular weight exceeds 1,000, developability becomes insufficient. A "polyphenol" compound used herein means a compound having at least two individual benzene rings. A "phenol" compound refers to a compound in which hydroxyl groups bond to part or all of the benzene rings, provided that at least two hydroxyl groups are present in one molecule.

A preferable embodiment of the polyphenol derivative compound (C) of the present invention is as follows. The number of phenyl groups (benzene ring) of the polyphenol derivative compound is usually from 2 to 12, preferably from 3 to 10, and particularly preferably from 3 to 6. These phenyl groups bond through —CR$^1$R$^2$—. R$^1$ is a hydrogen atom or a methyl group. R$^2$ is a hydrogen atom, a methyl group, acetyl group, phenyl group, or phenyl group having substituents. The number of the phenolic hydroxyl groups in the polyphenol derivative compound (C) is from 2 to 8, and preferably from 2 to 6.

The following formulas (1) to (9) are preferable examples of the polyphenol derivative compound (C):

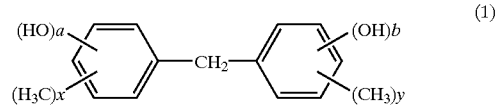

(1)

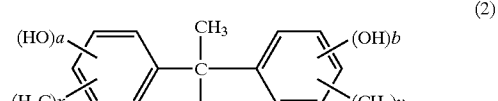

(2)

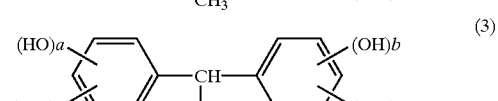

(3)

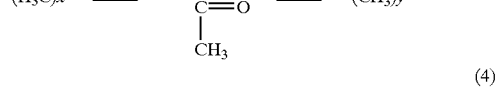

(4)

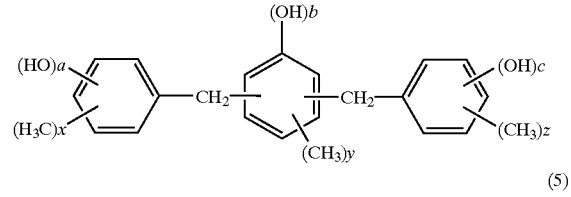

(5)

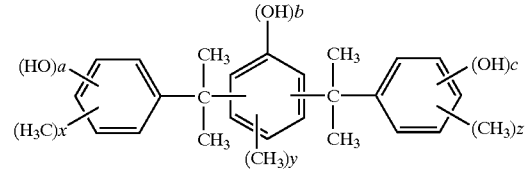

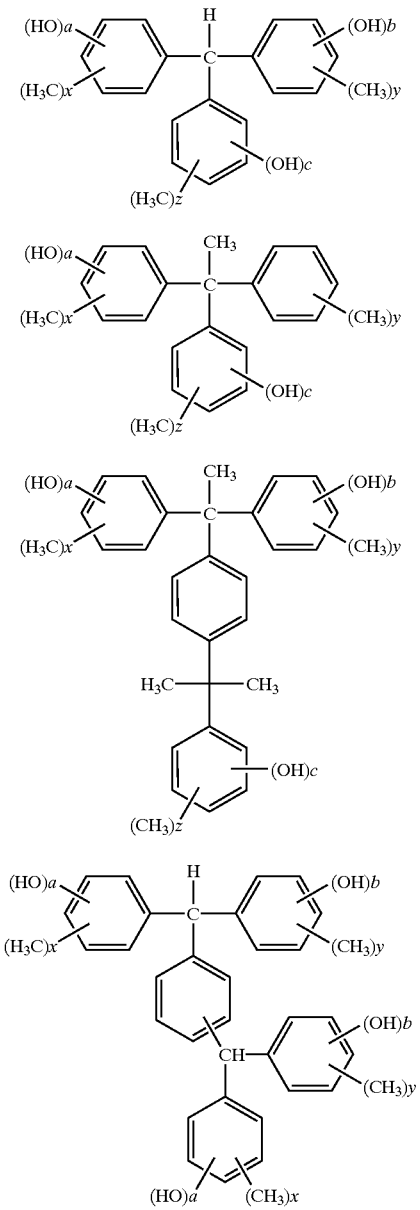

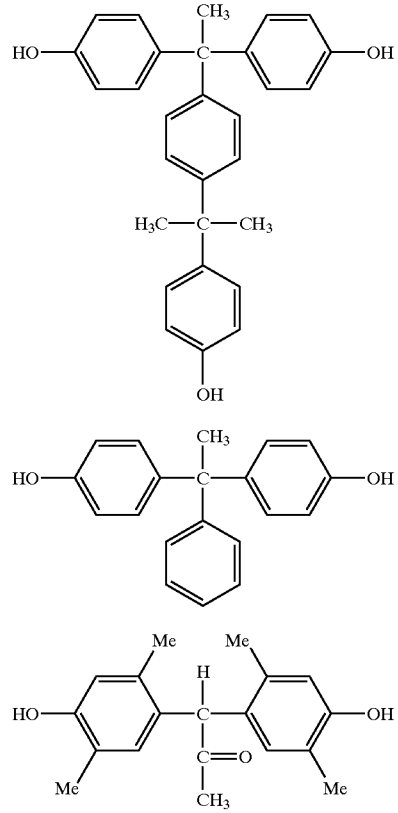

wherein subcript a, b, and c are each zero or an integer from one to three, with the proviso that not all of a, b, and c are zero; x, y, and z are individually zero or an integer from one to three with the proviso that $a+x \leqq 5$, $b+y \leqq 5$, and $c+z \leqq 5$ and with the proviso that in formulas (3) and (4), $b+y \leqq 4$.

Particularly preferable examples of the polyphenol derivative compound (C) are shown by the following formulas (C1) to (C4).

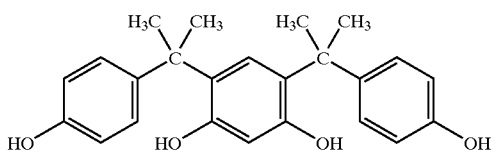

The proportion of the polyphenol derivative compound (C) in the resin component comprising the components (A), (B), and (C) as the essential components is preferably 3–40 wt %, and still more preferably 5–30 wt %. If the proportion is less than 3 wt %, patterning may be inferior due to a long developing time. If the proportion exceeds 40 wt %, it is difficult to control the pattern due to too short developing time.

(D) Compound Containing Naphthoquinonediazido Group

The compound containing a naphthoquinonediazido group used in the present invention includes complete ester compounds, partial ester compounds, amide compounds, or partial amide compounds of a compound having at least one phenolic hydroxyl group and naphthoquinone-1,2-diazido-4-sulfonic acid or naphthoquinone-1,2-diazido-5-sulfonic acid.

The naphthoquinonediazido group-containing compound (D) may be added to the composition of the present invention either individually or in combinations of two or more. The naphthoquinonediazido group-containing compound (D) is added in an amount preferably from 5 to 60 parts by weight, and still more preferably from 10 to 50 parts by weight, for 100 parts by weight of the resin component comprising the components (A), (B), and (C) as the essential components. If the amount is less than 5 parts by weight, an image conforming to the mask pattern cannot be obtained, thereby resulting in poor transcription. If the amount exceeds 60 parts by weight, resolution tends to decrease due to inadequate homogeneity of the photosensitive resin film.

(E) Solvent

The photosensitive resin composition of the present invention is preferably used by dissolving the components (A), (B), (C), and (D) in an appropriate solvent (E).

As examples of such a solvent, ethylene glycol alkyl ethers such as ethylene glycol monomethyl ether, ethylene glycol monoethyl ether, ethylene glycol monopropyl ether, and ethylene glycol monobutyl ether; diethylene glycol dialkyl ethers such as diethylene glycol dimethyl ether, diethylene glycol diethyl ether, diethylene glycol dipropyl ether, and diethylene glycol dibutyl ether; ethylene glycol alkyl acetates such as methylcellosolve acetate and ethylcellosolve acetate; propylene glycol alkyl ether acetates such as propylene glycol monomethyl ether acetate, propylene glycol monoethyl ether acetate, and propylene glycol monopropyl ether acetate; ketones such as acetone, methyl ethyl ketone, cyclohexanone, and methyl amyl ketone; aromatic hydrocarbons such as toluene and xylene; cyclic ether such as dioxane; and esters such as methyl 2-hydroxy propionate, ethyl 2-hydroxy propionate, ethyl 2-hydroxy-2-methyl propionate, ethyl 3-ethoxy propionate, ethyl ethoxy acetate, 2,2-oxyethyl diacetate, methyl 2-hydroxy-3-methyl butanoate, 3-methoxybutyl acetate, 3-methyl-3-methoxybutyl acetate, ethyl formate, ethyl acetate, butyl acetate, methyl acetoacetate, and ethyl acetoacetate can be given. These solvents can be used either individually or in combinations of two or more. Of these solvents, ethyl 2-hydroxy propionate and ethyl 3-ethoxy propionate are effective for thickly applying the photosensitive resin composition, because these solvents increase the viscosity of the composition solution. Moreover, the above two solvents scarcely pollute the environment.

It is preferable to add these solvents in an amount so that the solid concentration of the photosensitive resin composition is from 30 wt % to 65 wt % in order to produce a film with a thickness of 20 $\mu$m or more from the resulting photosensitive resin composition by a spin coating method. If the solid concentration is less than 30 wt %, it is difficult to produce a film with a thickness of 20 $\mu$m or more which is suitable as a material for forming bumps. If the solid concentration exceeds 65 wt %, fluidity of the composition decreases considerably, whereby handling becomes difficult. In addition, a homogeneous photosensitive resin composition film cannot be formed by a spin coating method.

Other Components:

Components which adjust the properties of the photosensitive resin composition, for example, alkali-soluble acrylic resins, surfactants, adhesion assistants, solubility controllers, viscosity controllers, fillers, pigments, and coloring agents can be added to the composition of the present invention.

Acrylic Resin:

The alkali-soluble acrylic resin of the present invention comprises a radically polymerizable compound unit having an alcoholic hydroxyl group and a radically polymerizable compound unit having at least a carboxyl group or a phenolic hydroxyl group. A "unit" used herein refers to the structure of radically polymerizable compounds after radical polymerization. Brief description of the alkali-soluble acrylic resin will be given below, which should not be construed as limiting the scope thereof. For example, an alkali-soluble acrylic resin disclosed in Japanese Patent Application Laid-open No. 207057/1998 can also be used.

As the radically polymerizable compound (a) having an alcoholic hydroxyl group, hydroxyalkyl (meth)acrylate is preferable. Specific examples include 2-hydroxyethyl acrylate and 2-hydroxyethyl methacrylate. As examples of the radically polymerizable compound (b) having a carboxyl group, acrylic acid, methacrylic acid, and 2-hexahydrophthaloyloxyethyl methacrylate can be given.

As examples of the radically polymerizable compound (c) having a phenolic hydroxyl group, 4-isopropenylphenol can be given.

In addition to these compounds, other radically polymerizable compounds (d) such as styrene, methyl methacrylate, ethyl methacrylate, and n-butyl acrylate can be added.

The ratio of the units (a), (b), (c), and (d) in the alkali-soluble acrylic resin of the present invention is (a):(b) and/or (c):(d)=10–80:3–50:0–60 (wt %), and preferably 20–60:5–40:0–50 (wt %). The ratio of each unit is appropriately determined while balancing the solubility in the photosensitive resin composition, developability, residual film rate, mechanical strength, and the like. These polymerizable compounds are polymerized in an organic solvent using a radical initiator.

Surfactant:

Surfactants may be added to the composition of the present invention in order to improve applicability, defoamability, leveling properties, and the like. As examples of surfactants, commercially available fluorine-containing surfactants such as BM-1000, BM-1100 (manufactured by BM Chemie), MEGAFAC F142D, F172, F173, F183 (manufactured by Dainippon Ink and Chemicals, Inc.), Fluorad FC-135, FC-170C, FC-430, FC-431 (manufactured by Sumitomo 3M Co., Ltd.), Surflon S-112, S-113, S-131, S-141, S-145 (manufactured by Asahi Glass Co., Ltd.), SH-28PA, SH-190, SH-193, SZ-6032, SF-8428 (manufactured by Toray-Dow Corning silicone Co., Ltd.), and NBX-15 (manufactured by NEOS Co., Ltd.), and non-ionic surfactants such as Nonion S-6, Nonion O-4, Pronon 201, Pronon 204 (manufactured by Nippon Oil and Fats Co., Ltd.), Emergen A-60, A-90, A-500 (manufactured by Kao Corp.) can be given. These surfactants can be used either individually or in combinations of two or more.

Surfactants are added preferably in the amount of 5 parts by weight or less for 100 parts by weight of the resin component comprising the components (A), (B), and (C) as the essential components.

Adhesion Promoter:

Adhesion promoters may be added to the composition of the present invention in order to improve adhesion to substrates. Functional silane coupling agents are effective as adhesion promoters. Functional silane coupling agents used herein mean silane coupling agents having a reactive substituent such as a carboxyl group, methacryloyl group, isocyanate group, or epoxy group. Specific examples include trimethoxysilylbenzoic acid, γ-methacryloxypropyltrimethoxysilane, vinyltriacetoxysilane, vinyltrimethoxysilane, γ-isocyanatepropyltriethoxysilane, γ-glycidoxypropyltrimethoxysilane, and β- (3,4-epoxycyclohexyl)ethyltrimethoxysilane. Adhesion promoters are added preferably in the amount of 20 parts by weight or less for 100 parts by weight of the resin component comprising the components (A), (B), and (C) as the essential components.

Solubility Controller:

The following compounds may be added to the composition of the present invention in order to properly adjust the solubility in an alkaline developer: monocarboxylic acids such as acetic acid, propionic acid, n-butyric acid, iso-butyric acid, n-valeric acid, isovaleric acid, benzoic acid, or cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, or syringinic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, trimellitic acid, pyromellitic acid, cyclopentanetetracarboxylic acid, butanetetracarboxylic acid, or 1,2,5,8-naphthalenetetracarboxylic acid; and acid anhydride such as itaconic anhydride, succinic anhydride, citraconic anhydride, dodecenylsuccinic anhydride, tricarbanylic anhydride, maleic anhydride, hexahydrophthalic anhydride, methyltetrahydrophthalic anhydride, hymic anhydride, 1,2,3,4-butanetetracarboxylic acid, cyclopentanetetracarboxylic dianhydride, phthalic anhydride, pyromellitic anhydride, trimellitic anhydride, benzophenonetetracarboxylic anhydride, ethylene glycol anhydrous bistrimellitate, or glycerol anhydrous bistrimellitate.

Moreover, a solvent with a high boiling point such as N-methylformamide N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylenecarbonate, propylenecarbonate, or phenylcellosolve acetate can be added.

There are no specific limitations to the amount of a solvent. The amount can be adjusted depending on uses and an application method of the composition, insofar as the composition is homogeneously mixed. The solvent is usually added so that the solid content of the resulting composition is 30–60 wt %.

Fillers, coloring agents, viscosity controllers, and the like can be added to the composition of the present invention as required. As examples of fillers, silica, alumina, talc, bentonite, zirconium silicate, and powdery glass can be given. As examples of coloring agents, extenders such as alumina white, clay, barium carbonate, and barium sulfate; inorganic pigments such as zinc oxide, white lead, chrome yellow, minium, ultramarine, iron blue, titanium oxide, zinc chromate, redironoxide, and carbon black; organic pigments such as brilliant carmin 6B, permanent red 6B, permanent red R, benzidine yellow, phthalocyanine blue, and phthalocyanine green; basic dyes such as magenta and rhodamine; direct dyes such as direct scarlet and direct orange; and acid dyes such as roccelline and metanil yellow can be given. As examples of viscosity controllers, bentonite, silica gel, and aluminum powder can be given. These additives are added preferably in the amount of 50 wt % or less of the resulting composition so as not to impair the essential characteristics of the composition.

In the case where fillers or pigments are not added, the composition of the present invention is prepared by mixing and stirring the composition by a usual method. In the case where fillers or pigments are added to the composition, the composition is dispersed and mixed using a dispersing machine such as a dissolver, homogenizer, or three roller roll mill. If necessary, the composition may be filtered using a mesh or membrane filter.

The resin film made of the photosensitive resin composition of the present invention is irradiated through a mask with a prescribed pattern. The irradiated area becomes alkali-soluble by a photoreaction. The resin film is developed using an alkaline developing solution to dissolve and remove the irradiated area. The resin film is thus patterned.

Use:

The composition of the present invention is suitable for use to produce thick films and has various other uses. For example, the composition is used as a protective film at the time of etching a substrate made of copper, chromium, iron, or glass, or a resist for manufacturing a semiconductor. The manufacture of bumps using the composition of the present invention as a photosensitive resin film (resist film) with a thickness of 20 $\mu$m or more will be described below.

(1) Formation of Photosensitive Resin Film:

In the present invention, the above composition solution is applied to a substrate, in particular, a substrate for electronic parts. The composition solution is dried (removing the solvent by heating or decompression) to form a photosensitive resin film with a thickness of 20–100 $\mu$m, and preferably 20–80 $\mu$m. A film with a thickness of less than 20 $\mu$m may be inadequate for forming bumps. On the other hand, it is difficult to produce a uniform film with a thickness exceeding 100 $\mu$m. As a method of applying the composition to the substrates, a spin coating method, roll coating method, screen printing method, applicator method, and the like are employed.

The pre-baking conditions for the film made of the composition of the present invention are usually 70–120° C., and preferably 100–120° C. for about 5–60 minutes, though the conditions vary depending on types and proportion of the components of the composition, thickness of the film, and the like. If the pre-baking time is too short, adhesion decreases at the time of development. If the pre-baking time is too long, the naphthoquinonediazido group-containing compound added as a photosensitizer is decomposed remarkably by heat, thereby resulting in reduced resolution.

(2) Irradiation:

The resulting film is irradiated through a mask with a prescribed pattern using ultraviolet rays or visible rays with a wavelength of 300–500 nm to expose only the patterned area where bumps are formed. As a irradiation light source, a low-pressure mercury lamp, high-pressure mercury lamp, super-high pressure mercury lamp, metal halide lamp, argon gas laser, and the like can be used. The radiation used herein is referred to as ultraviolet rays, visible rays, deep-ultraviolet rays, X-rays, electron beams, and the like.

The dose varies depending on types and proportion of the components in the composition, thickness of the film, and the like. For example, in the case of using a super-high pressure mercury lamp, the dose is 100–2,000 mJ/cm$^2$.

(3) Development:

After irradiation, the unnecessary area is dissolved and removed using an alkaline aqueous solution as a developer to cause only the unirradiated area to remain. As a developer, an aqueous solution of alkalis such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethyl ammonium hydroxide, tetraethyl ammonium hydroxide, pyrrole, piperidine, 1,8-diazabicyclo[5.4.0]-7-undecene, and 1,5-diazabicyclo [4.3.0]-5-nonane can be used. An aqueous solution comprising the above alkaline aqueous solution and an appropriate amount of water-soluble organic solvents such as methanol and ethanol or surfactants can also be used as a developer. The term "alkali-soluble" used in the present invention means capability of being dissolved in the above alkaline aqueous solution, for example, a 5% aqueous solution of sodium hydroxide.

The developing time is usually 1–30 minutes, though this varies depending on types and proportion of the components of the composition and the thickness of the dried composition film. As a developing method, any of a dipping method, paddle method, and spray developing method can be employed. After development, it is preferable to wash the film with streaming water for 30–90 seconds and to dry using an air gun or in an oven, for example.

(4) Electroplating:

The substrate patterned by development is electroplated by dipping the substrate in an electroplating solution at the same temperature and for the same period of time as the recommended conditions of plating solutions. Electroplating is evaluated by observing the surface conditions of the resist before and after dipping and changes in the pattern form.

(5) Removal Treatment:

The unexposed area of the positive-tone photo resist for a thick film of the present invention is removed from the substrate for which the resistance to a plating solution has been evaluated, by dipping the substrate in a stripper while stirring at a temperature from room temperature to 80° C. for 1–10 minutes. As a stripper, a mixed solution of dimethyl-sulfoxide and dimethylformamide can be used.

(6) Bump Formation Method:

When forming bumps, the photosensitive resin composition of the present invention is applied to a substrate for electronic parts and dried according to the above-described process to form a film with a thickness of 20–100 μm. The film is patterned and then electroplated to a thickness of 20–100 μm to form bumps.

EXAMPLES

The present invention will be explained in more detail by examples which are not intended to be limiting of the present invention. In the following examples, "part(s)" refers to "part(s) by weight" and "%" is "wt %" unless otherwise indicated.

(A) Novolac resin

Synthesis Example 1 m-Cresol and p-cresol were mixed in a weight ratio of 60:40. After the addition of formalin, the mixture was condensed by a conventional method using an oxalic acid catalyst to produce a cresol novolac resin. The low-molecular weight part of this resin was cut by fractionation to produce a novolac resin with a weight average molecular weight of 15,000. This resin is referred to as a novolac resin "A1".

Synthesis Example 2 m-Cresol, 2,3-xylenol, and 3,4-xylenol were mixed in a weight ratio of 80:10:10. After the addition of formalin, the mixture was condensed by a conventional method using an oxalic acid catalyst to produce a novolac resin. The low-molecular weight part of this resin was cut by fractionation to produce a novolac resin with a weight average molecular weight of 10,000. This resin is referred to as a novolac resin "A2".

Synthesis Example 3 m-Cresol, 2,3-xylenol, and 3,4-xylenol were mixed in a weight ratio of 60:30:10. After the addition of formalin, the mixture was condensed by a conventional method using an oxalic acid catalyst to produce a novolac resin. The low-molecular weight part of this resin was cut by fractionation to produce a novolac resin with a weight average molecular weight of 10,000. This resin is referred to as a novolac resin "A3".

Comparative Synthesis Example 1 m-Cresol and p-cresol were mixed in a weight ratio of 60:40. After the addition of formalin, the mixture was condensed by a conventional method using an oxalic acid catalyst to produce a cresol novolac resin. The low-molecular weight part of this resin was cut by fractionation to produce a novolac resin with a weight average molecular weight of 40,000. This resin is referred to as a novolac resin "CA1".

Comparative Synthesis Example 2 m-Cresol and p-cresol were mixed in a weight ratio of 60:40. After the addition of formalin, the mixture was condensed by a conventional method using an oxalic acid catalyst to produce a cresol novolac resin. The high-molecular weight part of this resin was cut by fractionation to produce a novolac resin with a weight average molecular weight of 1,500, which is outside the scope of the present invention. This resin is referred to as a novolac resin "CA2".

(B) Polyvinyl Lower Alkyl Ether and Comparative Polymers

A solution of polyvinyl methyl ether (PVME, weight average molecular weight: 50,000, hereinafter referred to as "1") in ethyl 2-hydroxy propionate with a concentration of 50% was prepared from a methanol solution of PVME (manufactured by Tokyo Kasei Organic Chemicals Co., Ltd., concentration: 50%) by solvent replacement using a rotary evaporator.

Comparative Polymers:

The following polymers were used as comparative polymers having a structure similar to polyvinyl lower alkyl ether.

Polyethylene glycol (Manufactured by Wako Pure Chemical Industries, Ltd., average molecular weight: 2,000) (hereinafter referred to as CB1)

Polypropylene glycol (Manufactured by Wako Pure Chemical Industries, Ltd., average molecular weight: 3,000) (hereinafter referred to as CB2)

Polyvinyl butyral (Manufactured by Wako Pure Chemical Industries, Ltd., polymerization degree: 200–400) (hereinafter referred to as CB3)

(C) Polyphenol Derivative Compounds

The chemical formulas of polyphenol derivative compounds "C1", "C2", "C3", "C4", and "CC1" used in the examples and comparative examples (all manufactured by Honshu Chemical Industry Co., Ltd.) are shown below. The molecular weights of "C1", "C2", "C3", "C4", and "CC1" are 377, 424, 290, 298, 1396, respectively. The polyphenol derivative compound "CC1" is outside the scope of the present invention.

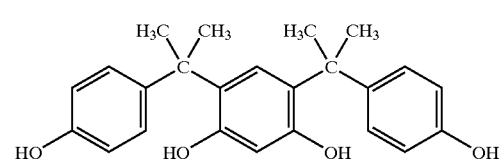

(C1)

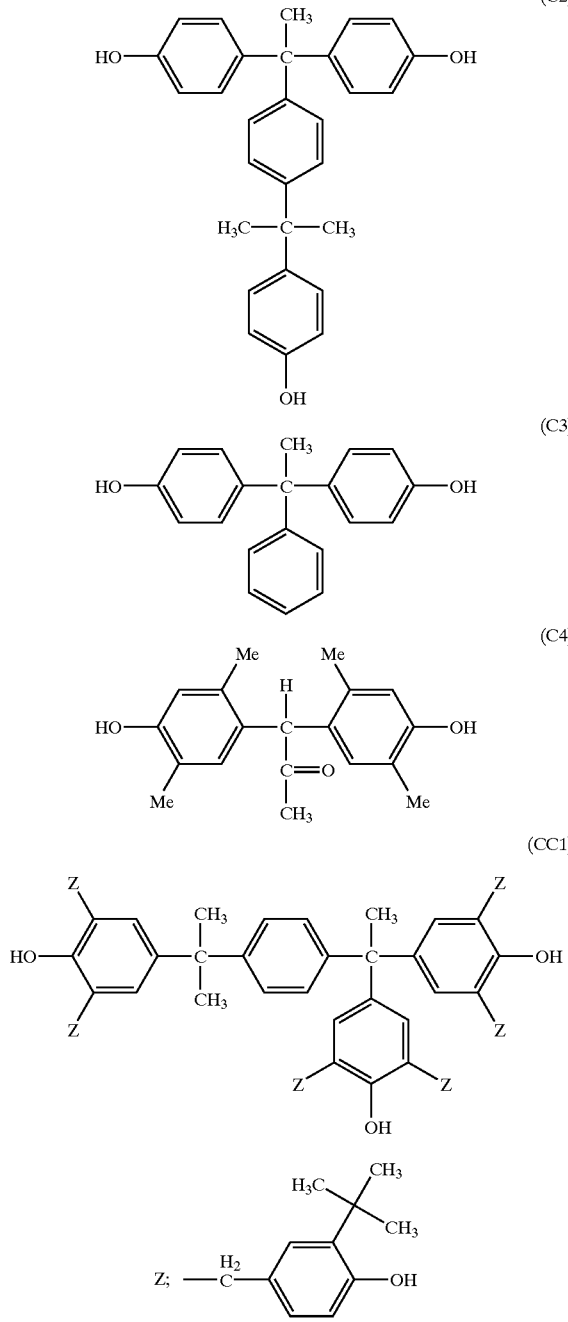

(D) Photosensitizer

In the examples and comparative examples, an esterification product of 1 mol of 4,4'-[1-[4-[1-(4-hydroxyphenyl)-1-methylethyl]phenyl]ethylidene]bisphenol and 2 mol of naphthoquinone-1,2-diazido-4-sulfonylchloride (hereinafter referred to as "D1") was used as a photosensitize. The chemical formula of this product is shown below.

(F) Acrylic Resin

An acrylic resin used in the examples was synthesized as follows. The atmosphere inside a flask equipped with a dry ice/methanol reflux condenser and a thermometer was replaced with nitrogen. The flask was charged with 3.0 g of 2,2'-azobisisobutylonitrile as a polymerization initiator and 225.0 g of ethyl 2-hydroxy propionate as a solvent. The mixture was stirred until the polymerization initiator was dissolved. After the addition of 75.0 g of 2-hydroxyethyl methacrylate, 60.0 g of n-butyl acrylate, and 15.0 g 2-hexahydrophthaloyloxyethyl methacrylate, the mixture was slowly stirred. The mixture was polymerized for 4 hours while raising the temperature of the solution to 80° C. The mixture was cooled to room temperature. After replacing the atmosphere inside the flask with air, 150 mg of p-methoxyphenol was added. The reaction product was dropped into a large quantity of methanol to be coagulated. After washing with water, the coagulated product was dissolved again in tetrahydrofuran of the same weight as the product, and the mixture was coagulated in a large quantity of methanol. These redissolution and coagulation steps were performed three times. The resulting coagulated product was dried under vacuum at 40° C. for 48 hours to produce an acrylic resin. This resin is referred to as an acrylic resin (F1).

Evaluation Method of Characteristics:

In the examples and comparative examples, the characteristics were evaluated by the following methods.

(1) Resolution:

A photosensitive resin composition was applied to a 4-inch silicon wafer substrate using a spinner. The compositions were soft-baked on a hot plate at 120° C. for 5 minutes to form a film with a prescribed thickness. The film was irradiated with ultraviolet rays at a dose of 1,500 mJ/cm$^2$ through a pattern mask for measuring resolution using a super-high pressure mercury lamp (HBO 1,000 W, manufactured by OSRAM). The film was developed in an aqueous solution of 2.38% tetramethyl ammonium hydroxide. The film was washed in a flow of water and blown dry with nitrogen to obtain a patterned substrate. The substrate was observed using an optical microscope to measure the resolution. The evaluation results were indicated by "⊙", "○", "Δ", "X".

The meaning of "⊙", "○", "Δ", and "X" in the case where the film thickness was 25 μm is as follows. ⊙: 40 μm pitch (30 μm width space, 10 μm width line) was resolved.

○: 40 μm pitch was not resolved and 50 μm pitch (35 μm width space, 15 μm width line) was resolved.

Δ: 50 μm pitch was not resolved and 80 μm pitch (50 μm width space, 30 μm width line) was resolved.

X 80 μm pitch was not resolved or was not resolved with good reproducibility.

Evaluation of the film with a different thickness is individually described.

(2) Crack Resistance (Plating Solution Resistance):

A patterned substrate with a prescribed thickness prepared in the same manner as in the evaluation of resolution was immersed in 2 liters of a non-cyanide gold plating solution (Microfab Au 100, manufactured by Electroplating Engineers of Japan Ltd.) at 60° C. for 60 minutes. The substrate was washed in a flow of water and dried by blowing with nitrogen gas to obtain a test specimen. The presence or absence of cracks was confirmed by observing the test specimen using an optical microscope immediately after drying and after 72 hours, respectively. As for substrates for which the resolution was evaluated as "X" with a 50 μm pitch, if an 80 μm pitch (50 μm width space, 30 μm width line) was resolved, the crack resistance was evaluated with an 80 μm pitch. The evaluation results were indicated by "○", "Δ", or "X".

○: No cracks were observed immediately after drying and after 72 hours as well.

Δ: Slight cracking was observed either immediately after drying or after 72 hours.

X: Cracks occurred all over the pattern.

(3) Plating Shape and Plating Spotting Out

A resist pattern with a prescribed thickness was formed on a 4-inch silicon wafer with a gold sputter provided on the surface thereof in the same manner as in the evaluation of resolution. The wafer was gold plated using 2 liters of a non-cyanide gold plating solution (Microfab Au 100, manufactured by Electroplating Engineers of Japan Ltd.) at 60° C. for 60 minutes with a current density of 0.5 A/dm$^2$. The plated substrate was washed in a flow of water and dried by blowing with nitrogen gas. The substrate was immersed in a 50%/50% mixed solution of dimethylsulfoxide and N,N'-dimethylformamide at room temperature for 5 minutes. The cured positive-tone photosensitive resin composition film was removed. The shape of the resulting plating (gold bumps) and the presence of plating spotting out were observed using an optical microscope and a scanning electron microscope. The evaluation results of the plating shape were indicated by "○", "Δ", or "X".

○: The pattern of the photosensitive resin composition film was precisely transferred to the shape of the resulting plating, and no nodule-like abnormal depositions were recognized.

Δ: The pattern of the photosensitive resin composition film was not precisely transferred to the shape of the resulting plating and slight nodule-like abnormal depositions were recognized.

X: The pattern of the photosensitive resin composition film was not precisely transferred to the shape of the resulting plating and nodule-like abnormal depositions were recognized.

Example 1

A photosensitive resin composition which comprises 60 parts of the novolac resin "A1", 30 parts of the the polyvinyl methyl ether (PVME) "B1", 10 parts of the polyphenol derivative compound "C1", 20 parts of the photosensitizer "D1", 0.1 part of BM-1000 (manufactured by BM Chemie) and 0.1 part of Nonion S-6 (manufactured by Kao Corp.) as surfactants (among the above components, components containing a solvent were indicated by part(s) excluding the solvent (solid content)), and ethyl 2-hydroxy propionate (hereinafter referred to as "E1") and ethyl 3-ethoxy propionate (hereinafter referred to as E2) as solvents was prepared. The solid content of the composition was 45%, and the ratio of ethyl 2-hydroxy propionate to ethyl 3-ethoxy propionate of the solvents was 50% to 50%. The photosensitive resin composition was filtered using a membrane filter with a pore size of 10 μm before the evaluation.

Resolution, crack resistance, plating shape, and plating spotting out of the film with a thickness of 25 μm were evaluated according to the method described above. The evaluation results are shown in Table 1.

Examples 2–8

Photosensitive resin compositions were prepared in the same manner as in the Example 1 except for changing types and amount of the novolac resin, amount of the polyvinyl methyl ether, and amount of the polyphenol derivative compound as shown in Table 1. The compositions were evaluated at a film thickness of 25 μm. The evaluation results are shown in Table 1.

Examples 9–12

Photosensitive resin compositions were prepared in the same manner as in the Example 1 except for changing the amount of the novolac resin and the amount of the polyphenol derivative compound as shown in Table 1. The compositions were evaluated with a film thickness of 25 μm. The evaluation results are shown in Table 1. All the polyphenol derivative compounds ("C2", "C3", and "C4") used in these examples were effective for achieving the object of the present invention.

Examples 13 and 14

The photosensitive resin composition prepared in the Example 1 was evaluated with a film thickness of 50 μm (example 13) and 75 μm (example 14). Resolution was evaluated with a 100 μm pitch (50 μm width space, 50μm width line). The pattern was resolved in both examples. Crack resistance, plating shape, and plating spotting out were evaluated with the same film thickness and the same pattern as in the evaluation of resolution. As a result, both compositions were rated as "○" in all the evaluations. The evaluation results are shown in Table 1.

Comparative Example 1

A photosensitive resin composition was prepared in the same manner as in the Example 1 except for using the novolac resin "CA1" with a weight average molecular weight of 40,000 as the novolac resin, which is outside the scope of the present invention. A 50 μm pitch was not resolved in the evaluation of resolution. An 80 μm pitch (50 μm width space, 30 μm width line) was also not resolved. Therefore, other items could not be evaluated. The evaluation results are shown in Table 1.

Comparative Example 2

A photosensitive resin composition was prepared in the same manner as in the Example 1 except for using the novolac resin "CA1" with a weight average molecular weight of 15,00 as the novolac resin, which is outside the scope of the present invention. A pattern was not resolved with good reproducibility in the evaluation of resolution due to too short development time. Therefore, other evaluation items were omitted. The evaluation results are shown in Table 1.

Comparative Examples 3, 4, and 5

Photosensitive resin compositions were prepared in the same manner as in the Example 1 except for using the polyethylene glycol (CB1), polypropylene glycol (CB2), polyvinyl butyral (CB3) respectively instead of the polyvinyl methyl ether "B1". In the case where either polyethylene glycol or polypropylene glycol was used, resolution was rated as "○", and crack resistance and plating shape were evaluated as "X". In the case of using polyvinyl butyral, neither a 50 μm pitch nor an 80 μm pitch was not resolved in the evaluation of resolution. Therefore, other evaluation items were omitted. The evaluation results are shown in Table 1.

Comparative Example 6

A photosensitive resin composition was prepared in the same manner as in the Example 1 except for using no polyphenol derivative compound and increasing the amount of the novolac resin A1 equivalent to the amount of the polyphenol derivative compound. A 50 μm pitch was not resolved. An 80 μm pitch was resolved. Crack resistance was evaluated as "○" with this pitch but the plating shape was evaluated as "X". The evaluation results are shown in Table 1.

Comparative Example 7

A photosensitive resin composition was prepared in the same manner as in the Example 1 except for using the compound "CC1" with a molecular weight of 1,396 instead of the polyphenol derivative compound "C1". A 50 μm pitch was not resolved, and an 80 μm pitch was resolved. Crack resistance with an 80 μm pitch was rated as "Δ" and the plating shape was evaluated as "X". The evaluation results are shown in Table 1.

TABLE 1

| | | Example | | | | | | | | | | | | | |
|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 |
| Composition | | | | | | | | | | | | | | | |
| Novorac resin | A1 | 60 | 80 | 40 | — | — | 65 | 55 | 50 | 60 | 60 | 60 | 50 | 60 | 60 |
| | A2 | — | — | — | 60 | — | — | — | — | — | — | — | — | — | — |
| | A3 | — | — | — | — | 60 | — | — | — | — | — | — | — | — | — |
| | CA1 | — | — | — | — | — | — | — | — | — | — | — | — | — | — |
| | CA2 | — | — | — | — | — | — | — | — | — | — | — | — | — | — |
| PVME | B1 | 30 | 10 | 50 | 30 | 30 | 30 | 30 | 30 | 30 | 30 | 30 | 30 | 10 | 10 |
| | CB1 | — | — | — | — | — | — | — | — | — | — | — | — | — | — |
| | CB2 | — | — | — | — | — | — | — | — | — | — | — | — | — | — |
| | CB3 | — | — | — | — | — | — | — | — | — | — | — | — | — | — |
| Polyphenol derivative compound | C1 | 10 | 10 | 10 | 10 | 10 | 5 | 15 | 20 | — | — | — | — | 10 | 10 |
| | C2 | — | — | — | — | — | — | — | — | 10 | — | — | — | — | — |
| | C3 | — | — | — | — | — | — | — | — | — | 10 | — | — | — | — |
| | C4 | — | — | — | — | — | — | — | — | — | — | 10 | 10 | — | — |
| | CC1 | — | — | — | — | — | — | — | — | — | — | — | — | — | — |
| Photosensitizer | D1 | 20 | 20 | 20 | 20 | 20 | 20 | 20 | 20 | 20 | 20 | 20 | 20 | 20 | 20 |
| Solvent | E1 | 73 | 73 | 73 | 73 | 73 | 73 | 73 | 73 | 73 | 73 | 73 | 73 | 73 | 73 |
| | E2 | 73 | 73 | 73 | 73 | 73 | 73 | 73 | 73 | 73 | 73 | 73 | 73 | 73 | 73 |
| Acrylic resin | F1 | — | — | — | — | — | — | — | — | — | — | — | 10 | — | — |
| Solid content (%) | | 45 | 45 | 45 | 45 | 45 | 45 | 45 | 45 | 45 | 45 | 45 | 45 | 45 | 45 |
| Evaluation | | | | | | | | | | | | | | | |
| Film thickness (μm) | | 25 | 25 | 25 | 25 | 25 | 25 | 25 | 25 | 25 | 25 | 25 | 25 | 50* | 75* |
| Resolution | | ⊚ | ⊚ | ○ | ⊚ | ⊚ | ○ | ⊚ | ○ | ⊚ | ⊚ | ⊚ | ⊚ | ○* | ○* |
| Crack resistance | | ○ | Δ | ○ | ○ | ○ | ○ | ○ | ○ | ○ | ○ | ○ | ○ | ○ | ○ |
| Plating shape | | ○ | ○ | ○ | ○ | ○ | ○ | ○ | ○ | ○ | ○ | ○ | ○ | ○ | ○ |
| Plating spotting out | | None | None | None | None | None | None | None | None | None | None | None | None | None | None |

| | | Comparative Example | | | | | | |
|---|---|---|---|---|---|---|---|---|
| | | 1 | 2 | 3 | 4 | 5 | 6 | 7 |
| Composition | | | | | | | | |
| Novorac resin | A1 | — | — | 60 | 60 | 60 | 70 | 60 |
| | A2 | — | — | — | — | — | — | — |
| | A3 | — | — | — | — | — | — | — |
| | CA1 | 60 | — | — | — | — | — | — |
| | CA2 | — | 60 | — | — | — | — | — |
| PVME | B1 | 30 | 30 | — | — | — | 30 | 30 |
| | CB1 | — | — | 30 | — | — | — | — |
| | CB2 | — | — | — | 30 | — | — | — |
| | CB3 | — | — | — | — | 30 | — | — |
| Polyphenol derivative compound | C1 | 10 | 10 | 10 | 10 | 10 | — | — |
| | C2 | — | — | — | — | — | — | — |
| | C3 | — | — | — | — | — | — | — |
| | C4 | — | — | — | — | — | — | — |
| | CC1 | — | — | — | — | — | — | 10 |

TABLE 1-continued

| | | | | | | | | |
|---|---|---|---|---|---|---|---|---|
| Photosensitizer | D1 | 20 | 20 | 20 | 20 | 20 | 20 | 20 |
| Solvent | E1 | 73 | 73 | 73 | 73 | 73 | 73 | 73 |
| | E2 | 73 | 73 | 73 | 73 | 73 | 73 | 73 |
| Acrylic resin | F1 | — | — | — | — | — | — | — |
| Solid content (%) | | 45 | 45 | 45 | 45 | 45 | 45 | 45 |
| Evaluation | | | | | | | | |
| Film thickness (μm) | | 25 | 25 | 25 | 25 | 25 | 25 | 25 |
| Resolution | | x | x | ⊚ | ⊚ | x | Δ | Δ |
| Crack resistance | | — | — | x | x | — | ○ | ○ |
| Plating shape | | — | — | x | x | — | x | x |
| Plating spotting out | | — | — | Observed | Observed | — | None | None |

*The compositions in Examples 13 and 14 were evaluated with 100 μm pitch (50 μm space, 50 μm line).

Note:

A1, A2, A3: Novolac resin

CA1: High-molecular weight novolac resin

CA2: Low-molecular weight novolac resin

PVMEB1: Polyvinyl methyl ether

CB1: Polyethylene glycol

CB2: Polypropylene glycol

CB3: Polyvinyl butyral

C1–C4: Polyphenol derivative compound

CC1: Polyphenol derivative compound (molecular weight of more than 1,000).

E1: Ethyl 2-hydroxy propionate

E2: Ethyl 3-etoxy propionate

D1: Esterification product of 1 mol of 4,4'-[1-[4-[1-(4-hydroxyphenyl)-1-methylethyl]phenyl]ethylidene]bisphenol and 2 mol of naphthoquinone-1,2-diazido-4-sulfonylchloride F1: Acrylic resin Numbers in Table 1 are indicated by part(s) by weight (the solid content is indicated by wt %).

The photosensitive resin composition of the present invention can produce a film with a thickness of 20 μm or more. A good pattern can be formed by irradiating the film through a mask and developing the film. Since the film exhibits superior plating solution resistance when plated after patterning, no cracks occur in the resin film during plating or on washing with water and drying after the plating, and the film can be replated. The photosensitive resin composition is suitable as a material for forming bumps on substrates for electronic parts.

What is claimed is:

1. A photosensitive resin composition comprising (A) a novolac resin with a weight average molecular weight of 2,000–30,000, (B) a polyvinyl lower alkyl ether, (C) a polyphenol derivative compound with a molecular weight of 200–1,000, and (D) a compound containing a naphthoquinonediazido group.

2. The photosensitive resin composition according to claim 1, which comprises 5–60 wt % of the naphthoquinone diazido group-containing compound (D) for 100 wt % of a resin component comprising 30–90 wt % of the novolac resin (A), 5–60 wt % of the polyvinyl lower alkyl ether (B), and 3–40 wt % of the polyphenol derivative compound (C).

3. The photosensitive resin composition according to claim 1, wherein the polyphenol derivative compound (C) is at least one compound selected from the group consisting of compounds having formulas (1)–(9):

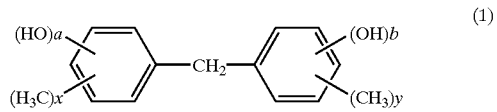

(1)

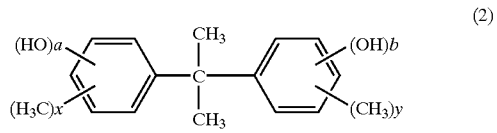

(2)

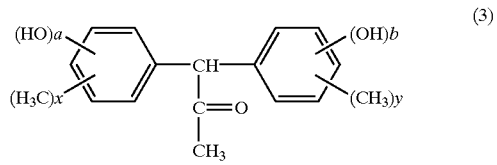

(3)

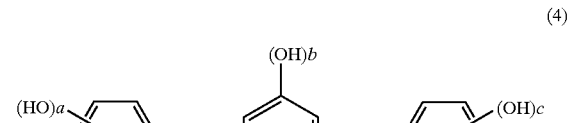

(4)

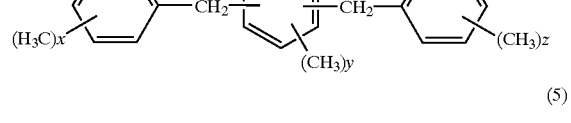

(5)

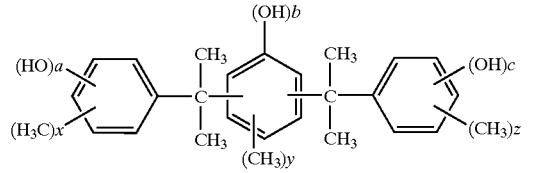

(6)

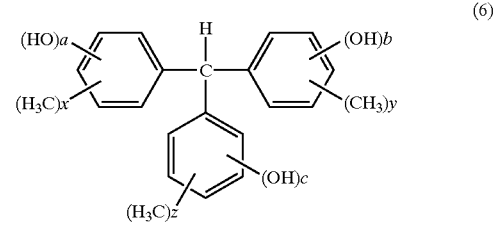

(7)

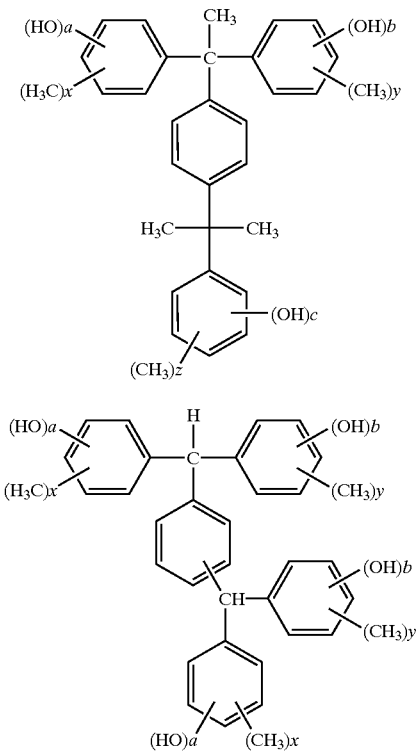

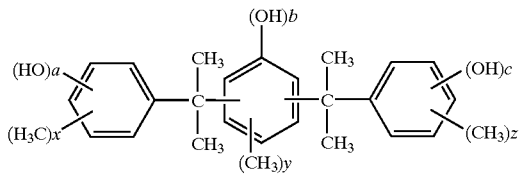

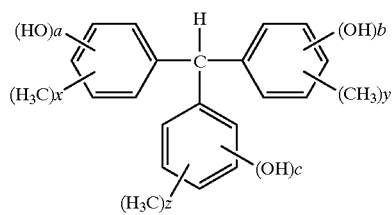

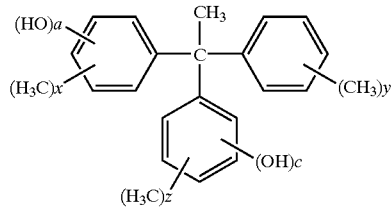

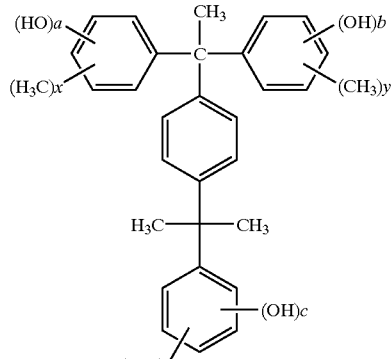

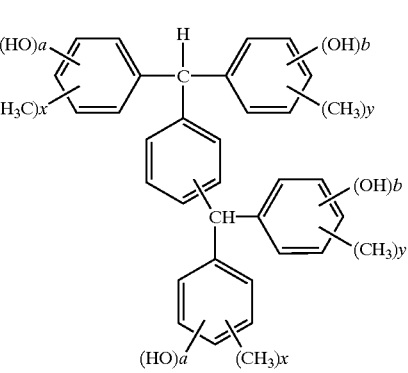

wherein subscript a, b, and c are each zero or an integer from one to three, with the proviso that not all of a, b, and c are zero; x, y, and z are individually zero or an integer from one to three with the proviso that $a+x \leq 5$, $b+y \leq 5$, and $c+z \leq 5$ and with the proviso that in formulas (3) and (4), $b+y \leq 4$.

4. The photosensitive resin composition according to claim 2, wherein the polyphenol derivative compound (C) is at least one compound selected from the group consisting of compounds having formulas (1)–(9):

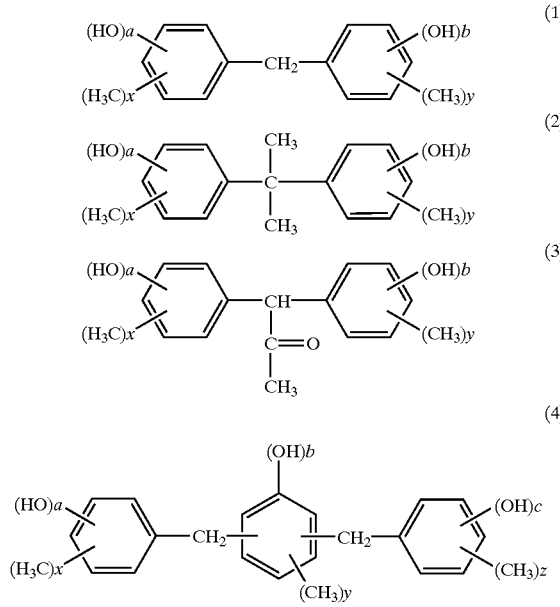

wherein subscript a, b, and c are each zero or an integer from one to three, with the proviso that not all of a, b, and c are zero; x, y, and z are individually zero or an integer from one to three with the proviso that $a+x \leq 5$, $b+y \leq 5$, and $c+z \leq 5$ and with the proviso that in formulas (3) and (4), $b+y \leq 4$.

5. The photosensitive resin composition according to claim 1, which comprises a solvent (E) which is ethyl 2-hydroxypropionate, ethyl 3-ethoxypropionate, or a mixture thereof.

6. The photosensitive resin composition according to claim 2, which comprises a solvent (E) which is ethyl 2-hydroxypropionate, ethyl 3-ethoxypropionate, or a mixture thereof.

7. The photosensitive resin composition according to claim 3, which comprises a solvent (E) which is ethyl 2-hydroxypropionate, ethyl 3-ethoxypropionate, or a mixture thereof.

8. A photosensitive resin film which is prepared by applying the photosensitive resin composition of claim 1 to a substrate; and then drying the applied resin composition.

9. A photosensitive resin film which is prepared by applying the photosensitive resin composition of claim 2 to a substrate; and then drying the applied resin composition.

10. A method of forming projection electrodes on a substrate, comprising applying the photosensitive resin composition of claim 1 to a substrate for an electronic part; patterning the applied composition; and electroplating the substrate to a thickness of 20–100 $\mu$m, thereby forming the projection electrodes which function as connecting terminals in the completed electronic part.

11. A method of forming projection electrodes on a substrate, comprising applying the photosensitive resin composition of claim 2 to a substrate for an electronic part; patterning the applied composition; and electroplating the substrate to a thickness of 20–100 $\mu$m, thereby forming the projection electrodes which function as connecting terminals in the completed electronic part.

12. The photosensitive resin composition according to claim 1, which comprises 10–50 wt. % of the naphthoquinonediazido group-containing compound (D) per 100 wt. % of a resin component comprising 40–80 wt. % of the novolac resin (A), 5–50 wt. % of the polyvinyl lower alkyl ether (B), and 5–30 wt. % of the polyphenol derivative compound (C).

* * * * *